US010586950B2

(12) United States Patent
Kim et al.

(10) Patent No.: US 10,586,950 B2
(45) Date of Patent: Mar. 10, 2020

(54) DISPLAY DEVICE HAVING REDUCED DEFECTS

(71) Applicant: Samsung Display Co., Ltd., Yongin-Si, Gyeonggi-Do (KR)

(72) Inventors: Sungman Kim, Seoul (KR); Wonho Kim, Seongnam-si (KR); Yeonmun Jeon, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/615,617

(22) Filed: Jun. 6, 2017

(65) Prior Publication Data

US 2017/0352843 A1    Dec. 7, 2017

(30) Foreign Application Priority Data

Jun. 7, 2016   (KR) ......................... 10-2016-0070183

(51) Int. Cl.
*H01L 51/52*      (2006.01)
*H01L 27/32*      (2006.01)
(Continued)

(52) U.S. Cl.
CPC ....... *H01L 51/5284* (2013.01); *G09G 3/3208* (2013.01); *G09G 3/3233* (2013.01); *G09G 3/3674* (2013.01); *H01J 1/62* (2013.01); *H01L 27/28* (2013.01); *H01L 27/326* (2013.01); *H01L 27/3244* (2013.01); *G09G 2300/0417* (2013.01); *G09G 2300/0426* (2013.01); *G09G 2310/08* (2013.01); *G09G 2320/0223* (2013.01); *H01L 27/322* (2013.01); *H01L 27/3211* (2013.01)

(58) Field of Classification Search
CPC . H01L 51/5284; H01L 27/28; H01L 27/3211; H01L 27/322; H01L 27/3244; G09G 3/3208; G09G 3/3233; G09G 2300/0417; H01J 1/62
USPC .......................................... 345/82
See application file for complete search history.

(56) References Cited

U.S. PATENT DOCUMENTS 9,052,538 B2    6/2015  Lee
2008/0198283 A1*  8/2008  Yoon ................... G09G 3/3648
                                           349/37

(Continued)

FOREIGN PATENT DOCUMENTS

KR    10-2013-0120283 A    11/2013
KR    10-2015-0082849 A    7/2015
KR    10-2015-0139132 A    12/2015

*Primary Examiner* — Jennifer Mehmood
*Assistant Examiner* — Ngan T Pham Lu
(74) *Attorney, Agent, or Firm* — Innovation Counsel LLP

(57) ABSTRACT

A display device includes: a first pixel group including first, second and third pixels arranged adjacent to each other and positioned successively along a first direction; and a second pixel group including fourth, fifth and sixth pixels arranged adjacent to the first pixel group and positioned successively along the first direction. Multiple ones of each of the first pixel group and the second pixel group are arranged in an alternating manner along both the first direction and a second direction intersecting the first direction. The second pixel and the fifth pixel face each other with respect to a first gate line while being connected to the first gate line, the first pixel and the fourth pixel face each other with respect to a second gate line while being connected to the second gate line.

19 Claims, 6 Drawing Sheets

(51) Int. Cl.
*G09G 3/36* (2006.01)
*G09G 3/3208* (2016.01)
*G09G 3/3233* (2016.01)
*H01J 1/62* (2006.01)
*H01L 27/28* (2006.01)

(56) References Cited

U.S. PATENT DOCUMENTS

| | | | | |
|---|---|---|---|---|
| 2010/0109994 | A1* | 5/2010 | Lee | G02F 1/136286 |
| | | | | 345/98 |
| 2013/0044281 | A1* | 2/2013 | Zhou | G02F 1/136286 |
| | | | | 349/73 |
| 2015/0187293 | A1* | 7/2015 | Yoo | G09G 3/3607 |
| | | | | 345/694 |
| 2015/0194116 | A1 | 7/2015 | Lee et al. | |
| 2015/0348481 | A1* | 12/2015 | Hong | G09G 3/2003 |
| | | | | 345/690 |
| 2016/0021321 | A1* | 1/2016 | Kim | H04N 5/376 |
| | | | | 348/308 |
| 2016/0315127 | A1* | 10/2016 | Yoon | H01L 27/3218 |

* cited by examiner

DISPLAY DEVICE HAVING REDUCED DEFECTS

CROSS-REFERENCE TO RELATED APPLICATION

This application claims priority to Korean Patent Application No. 10-2016-0070183 filed on Jun. 7, 2016, and all the benefits accruing therefrom under 35 U.S.C. § 119, the content of which in its entirety is herein incorporated by reference.

BACKGROUND

1. Field

Exemplary embodiments of the invention relate generally to display devices, and more specifically to display devices having reduced defects.

2. Description of the Related Art

Display devices may be classified into liquid crystal display ("LCD") devices, organic light emitting diode ("OLED") display devices, plasma display panel ("PDP") devices, electrophoretic display devices, and the like.

The display device includes a plurality of pixel electrodes arranged in a matrix form, a gate line applying a gate signal to each pixel electrode, a data line applying a data signal to each pixel electrode, a thin film transistor ("TFT") connecting the pixel electrode, the gate line and the data line, and the like.

In addition, the display device includes a gate driver applying a gate driving signal to each gate line, and a data driver applying a data signal to each data line. The gate driver and the data driver may be integrated into a non-display area of a display panel, along with the gate line, the data line, and the TFT.

In recent times, a narrow bezel structure in which a width of the non-display area is substantially minimized is in need. In order to achieve a narrow bezel, an interlaced scheme is suggested in which gate drivers are provided on both the left and right sides of a display area, and gate driving signals are output from the gate drivers in an alternating manner to substantially minimize an area occupied by the gate driver.

However, in such an example, there is an issue of horizontal line defects due to delays of the gate driving signals applied from the gate drivers on the left and right sides.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Exemplary embodiments of the invention are directed to a display device which is capable of substantially minimizing an area occupied by its gate driver, so as to realize a narrow bezel and substantially prevent horizontal line defects to improve display quality.

According to an exemplary embodiment of the invention, a display device includes: a first pixel group including first, second and third pixels arranged adjacent to each other and positioned successively along a first direction; and a second pixel group including fourth, fifth and sixth pixels arranged adjacent to the first pixel group and positioned successively along the first direction. Multiple ones of each of the first pixel group and the second pixel group are arranged in an alternating manner along both the first direction and a second direction intersecting the first direction. The second pixel and the fifth pixel face each other with respect to a first gate line while being connected to the first gate line, and the first pixel and the fourth pixel face each other with respect to a second gate line while being connected to the second gate line.

The third pixel and the sixth pixel face each other with respect to the first gate line and may be connected to different gate lines, respectively.

The first, second and third pixels may be connected to an odd-numbered data line, and the fourth, fifth and sixth pixels may be connected to an even-numbered data line.

The display device may further include: a first gate driver disposed proximate to one side of a substrate and connected to the first gate line; and a second gate driver disposed proximate to another side of the substrate and connected to the second gate line.

The first gate line and the second gate line may extend in the first direction and be arranged in an alternating manner along the second direction.

The odd-numbered data line and the even-numbered data line may extend in the second direction and be arranged in an alternating manner along the first direction.

The first pixel and the fourth pixel may be arranged in an alternating manner along the second direction.

The second pixel and the fifth pixel may be arranged in an alternating manner along the second direction.

The third pixel and the sixth pixel may be arranged in an alternating manner along the second direction.

The odd-numbered data line may be configured to receive a voltage having a different polarity from a polarity of a voltage configured to be applied to the even-numbered data line.

The first, second and third pixels may be configured to receive voltages having a different polarity from a polarity of voltages configured to be applied to the fourth, fifth and sixth pixels.

The first pixel and the fourth pixel may each be pixels selected from a red pixel and a green pixel.

The second pixel and the fifth pixel may each be pixels selected from a red pixel and a green pixel.

The third pixel and the sixth pixel may be blue pixels.

According to another exemplary embodiment of the invention, a display device includes: a first pixel group including first, second, third and fourth pixels arranged adjacent to each other and positioned successively along a first direction; and a second pixel group including fifth, sixth, seventh and eighth pixels arranged adjacent to the first pixel group and positioned successively along the first direction. Multiple ones of each of first pixel group and the second pixel group are arranged in an alternating manner along both the first direction and a second direction intersecting the first direction. The first pixel and the fifth pixel face each other with respect to a first gate line while being connected to the first gate line, and the third pixel and the seventh pixel face each other with respect to the first gate line while being connected to the first gate line. The second pixel and the sixth pixel face each other with respect to a second gate line while being connected to the second gate line, and the fourth pixel and the eighth pixel face each other with respect to the second gate line while being connected to the second gate line.

The first, second, third and fourth pixels may be connected to an even-numbered data line, and the fifth, sixth, seventh and eighth pixels may be connected to an odd-numbered data line.

The odd-numbered data line may be configured to receive a voltage having a different polarity from a polarity of a voltage configured to be applied to the even-numbered data line.

The first, second, third and fourth pixels may be configured to receive voltages having a different polarity from a polarity of voltages configured to be applied to the fifth, sixth, seventh and eighth pixels.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present disclosure of invention will be more clearly understood from the following detailed description taken in conjunction with the accompanying drawings, in which.

DETAILED DESCRIPTION

Figure 1:
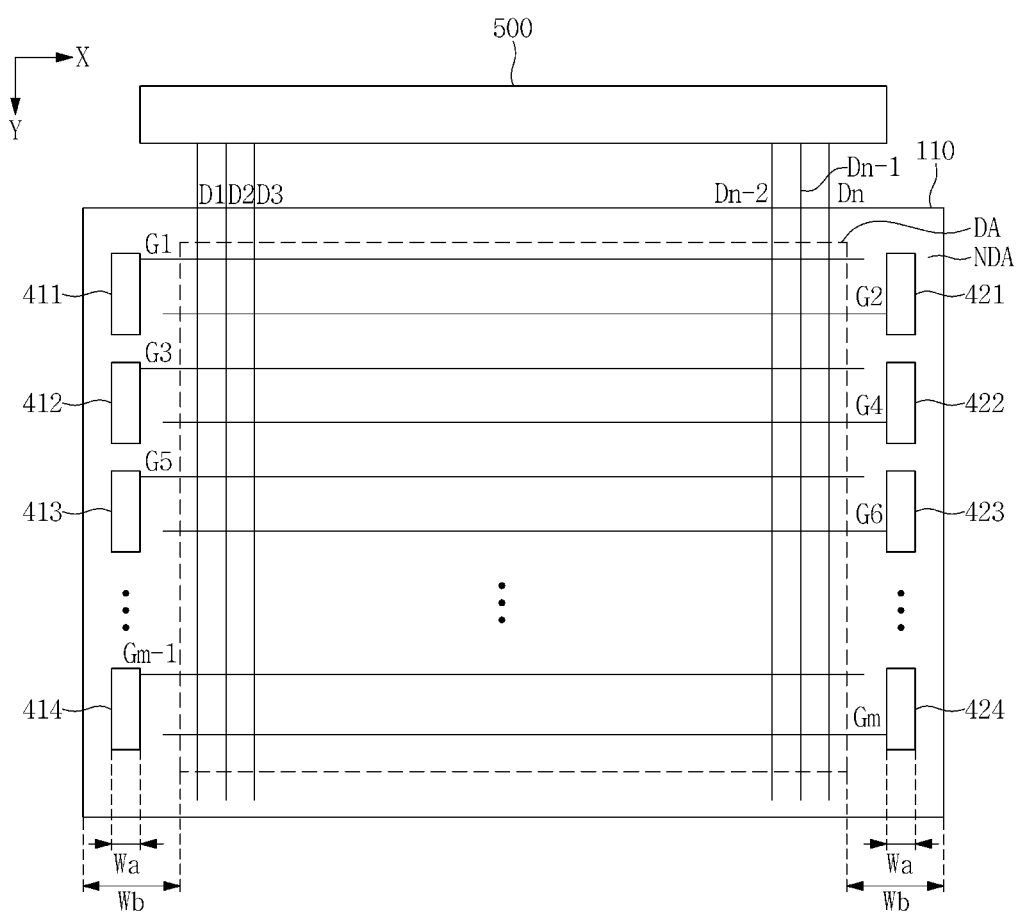
FIG. 1 is a schematic block diagram illustrating a display device according to an exemplary embodiment.

Advantages and features of the invention and methods for achieving them will be made clear from exemplary embodiments described below in detail with reference to the accompanying drawings. The invention may, however, be embodied in many different forms and should not be construed as being limited to the exemplary embodiments set forth herein. Rather, these exemplary embodiments are provided so that this disclosure will be thorough and complete, and will fully convey the scope of the invention to those skilled in the art. The invention is merely defined by the scope of the claims. Accordingly, well-known constituent elements, operations and techniques are not described in detail in the exemplary embodiments in order to prevent the invention from being obscurely interpreted. Like reference numerals refer to like elements throughout the specification.

In the drawings, thicknesses of a plurality of layers and areas are illustrated in an enlarged manner for clarity and ease of description thereof. The various drawings are thus not to scale. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "less", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification. All numerical values are approximate, and may vary. All examples of specific materials and compositions are to be taken as nonlimiting and exemplary only. Other suitable materials and compositions may be used instead.

Some of the parts which are not associated with the description may not be provided in order to specifically describe embodiments of the present invention, and like reference numerals refer to like elements throughout the specification.

A display device according to an exemplary embodiment is described on the premise that it is a liquid crystal display ("LCD") device. However, the scope of the present invention is not limited to the LCD device, and for example, the present invention may be applied to an organic light emitting diode ("OLED") display device.

In addition, the display device according to an exemplary embodiment is described on the premise that it is an LCD device of a plane to line switching ("PLS") mode. However, the scope of the present invention is not limited to the LCD device of the PLS mode, and for example, the present invention may be applied to an LCD device of a TN mode, an LCD device of a VA mode, or an LCD device of an IPS mode, as well as an OLED display device.

Figure 2:
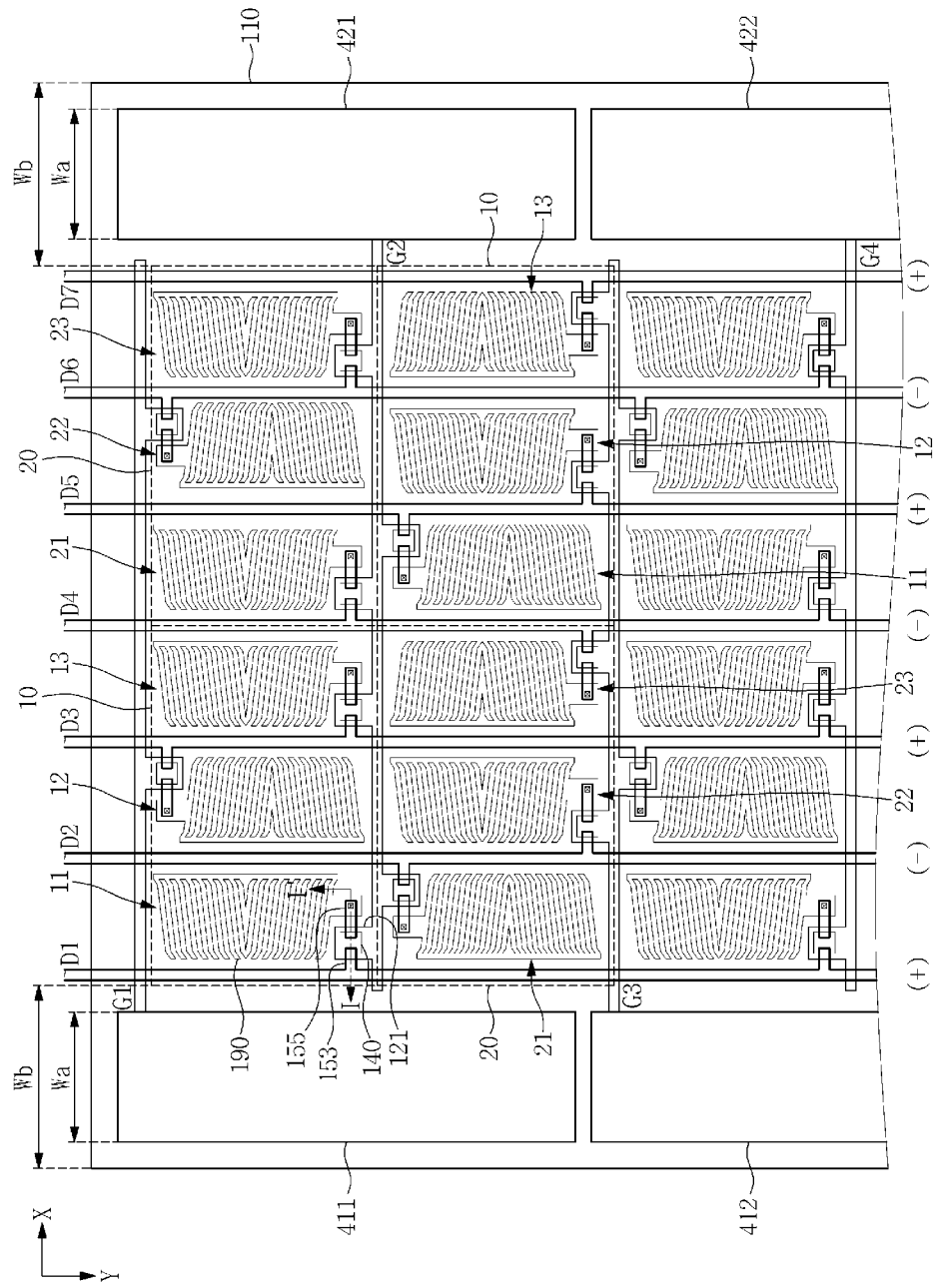
FIG. 2 is a schematic plan view illustrating a display device according to an exemplary embodiment.
Figure 3:
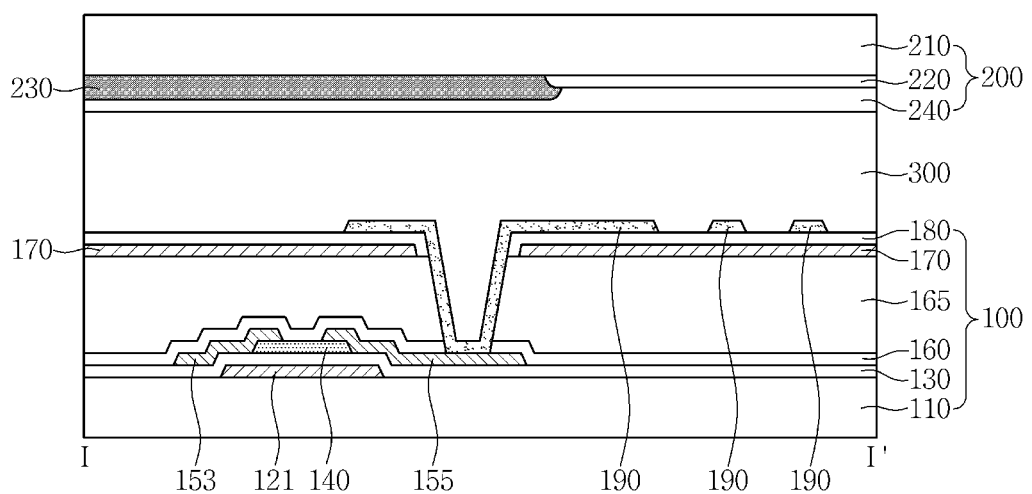
FIG. 3 is a cross-sectional view taken along line I-I' of FIG. 2.

Referring to FIGS. 1, 2 and 3, a display device according to an exemplary embodiment includes a display substrate 100, an opposing substrate 200, a liquid crystal layer 300 between the display substrate 100 and the opposing substrate 200, first gate drivers 411, 412 and 413, second gate drivers 421, 422 and 423, and a data driver 500. In addition, the display device according to an exemplary embodiment may further include a backlight unit (not illustrated) that outputs light toward the display substrate 100.

The display substrate 100 includes a first substrate 110, a gate wiring G1 to Gm and 121, a first insulating layer 130, a semiconductor layer 140, a data wiring D1 to Dn, 153 and 155, a second insulating layer 160, an organic layer 165, a first electric field generating electrode 170, a third insulating layer 180, a second electric field generating electrode 190, and the like.

The first substrate 110 includes a display area DA for displaying an image and a non-display area NDA surrounding the display area DA. The first substrate 110 may be an insulating substrate, e.g., a plastic substrate, having light transmitting characteristics and flexible characteristics. However, exemplary embodiments are not limited thereto, and the first substrate 110 may include a hard substrate such as a glass substrate.

The gate wiring G1 to Gm and 121 includes a plurality of gate lines G1 to Gm extending successively in a first direction X and arranged parallel to one another to each extend along a second direction Y that intersects the first direction X, and a gate electrode 121 protruding from each of the gate lines G1 to Gm.

The gate wiring G1 to Gm and 121 may include aluminum (Al) or alloys thereof, silver (Ag) or alloys thereof, copper (Cu) or alloys thereof, molybdenum (Mo) or alloys thereof, chromium (Cr), tantalum (Ta), titanium (Ti), and/or the like.

In addition, the gate wiring G1 to Gm and 121 may have a multilayer structure including two or more conductive layers (not illustrated) having different physical properties. For example, one conductive layer of the multilayer structure may include a metal having low resistivity to reduce signal delay or voltage drop, e.g., an aluminum (Al)-based metal, a silver (Ag)-based metal, and a copper (Cu)-based metal, and another conductive layer of the multilayer structure may include a material that is found to impart an excellent contact property with indium tin oxide (ITO) and indium zinc oxide (IZO), e.g., a molybdenum-based metal, chromium, titanium, tantalum, and the like.

Examples of the multilayer structure may include a chromium lower layer and an aluminum upper layer, an aluminum lower layer and a molybdenum upper layer, and a titanium lower layer and a copper upper layer. However, exemplary embodiments are not limited thereto, and the gate wiring G1 to Gm and 121 may include various kinds of metals and conductors.

The first insulating layer 130 is disposed on the first substrate 110 on which the gate wiring G1 to Gm and 121 is disposed. The first insulating layer 130 may include silicon oxide ($SiO_x$) or silicon nitride ($SiN_x$). In addition, the first insulating layer 130 may further include aluminum oxide, titanium oxide, tantalum oxide or zirconium oxide.

The semiconductor layer 140 is disposed on the first insulating layer 130. The semiconductor layer 140 may substantially overlap the gate electrode 121. The semiconductor layer 140 may be an a-si semiconductor, a poly-si semiconductor, or an oxide semiconductor.

The data wiring D1 to Dn, 153 and 155 is disposed on the semiconductor layer 140.

The data wiring D1 to Dn, 153 and 155 includes a plurality of data lines D1 to Dn extending in the second direction Y and arranged parallel to one another along the first direction X, a source electrode 153 branching off from each of the data lines D1 to Dn, and a drain electrode 155 spaced apart from the source electrode 153. The source electrode 153 and the drain electrode 155, along with the gate electrode 121, define three terminals of a thin film transistor ("TFT"). The data wiring D1 to Dn, 153 and 155 may include a substantially same material as that included in the gate wiring G1 to Gm and 121.

The second insulating layer 160 is disposed on the first substrate 110 on which the data wiring D1 to Dn, 153 and 155 is disposed. The second insulating layer 160 may include silicon oxide ($SiO_x$) or silicon nitride ($SiN_x$). In addition, the second insulating layer 160 may further include aluminum oxide, titanium oxide, tantalum oxide or zirconium oxide.

The organic layer 165 is disposed on the second insulating layer 160. The organic layer 165 may include any suitable organic insulator, and may have a thickness ranging from about 1.0 μm to about 3.5 μm.

The first electric field generating electrode 170 is disposed on the organic layer 165. The first electric field generating electrode 170 may be a surface electrode. In addition, the first electric field generating electrode 170 may include a transparent conductor such as indium tin oxide (ITO) or indium zinc oxide (IZO).

The third insulating layer 180 is disposed on the first substrate 110 over the first electric field generating electrode 170. The third insulating layer 180 may include silicon oxide ($SiO_x$) or silicon nitride ($SiN_x$). In addition, the third insulating layer 180 may further include aluminum oxide, titanium oxide, tantalum oxide or zirconium oxide.

The second electric field generating electrode 190 is disposed on the third insulating layer 180 to overlap the first electric field generating electrode 170. The second electric field generating electrode 190 according to an exemplary embodiment may have a shape including a stem portion and branch portions extending in a diagonal direction from the stem portion, and may include a transparent conductor such as indium tin oxide (ITO) or indium zinc oxide (IZO).

However, exemplary embodiments are not limited thereto, and the arranged position and shape of the first electric field generating electrode 170 and the second electric field generating electrode 190 may be variously modified based on, for example, the mode (TN mode, VA mode and IPS mode) of the LCD device.

The opposing substrate 220 includes a second substrate 210, a color filter 220, a light blocking layer 230, an overcoat layer 240, and the like.

The second substrate 210 may be an insulating substrate including plastic or transparent glass such as soda lime glass or borosilicate glass, for example.

The color filter 220 and the light blocking layer 230 are disposed on the second substrate 210.

The color filter 220 may be one selected from a filter of any color, such as: a red color filter, a green color filter, a blue color filter, a cyan color filter, a magenta color filter, a yellow color filter and a white color filter. Three primary colors, such as those of red, green and blue, or cyan, magenta and yellow may define a basic pixel group for representing a color.

The light blocking layer 230 defines an aperture area through which light is transmitted. The light blocking layer 230 is also referred to as a black matrix, and defines a pixel area. The light blocking layer 230 may include a metal such as chrome oxide (CrOx) or an opaque organic layer material.

The overcoat layer 240 is disposed on the color filter 220 and the light blocking layer 230. The overcoat layer 240 planarizes an uneven surface of a layer therebelow, e.g., the color filter 220 and the light blocking member 230, and efficiently suppresses or prevents emission of undesired materials from the layer therebelow.

The first gate drivers 411, 412, 413 and 414 and the second gate drivers 421, 422, 423 and 424 may be disposed at the non-display area NDA of the first substrate 110.

The first gate drivers 411, 412, 413 and 414 and the second gate drivers 421, 422, 423 and 424 may be directly embedded on the non-display area NDA of the first substrate 110 in the form of at least one integrated circuit (IC) chip. Such a structure may be also referred to as an amorphous silicon gate (ASG) structure.

However, exemplary embodiments are not limited thereto, and the first gate drivers 411, 412, 413 and 414 and the second gate drivers 421, 422, 423 and 424 may for example be mounted on a flexible printed circuit film to be attached to the first substrate 110 in the form of a tape carrier package (TCP), or may be mounted on a separate printed circuit board (PCB) to be attached to the first substrate 110.

The first gate drivers 411, 412, 413 and 414 may be connected to odd-numbered gate lines G1, G3 . . . , respectively, and the second gate drivers 421, 422, 423 and 424 may be connected to even-numbered gate lines G2, G4 . . . , respectively.

However, exemplary embodiments are not limited thereto, and the first gate drivers 411, 412, 413 and 414 may be connected to the even-numbered gate lines G2, G4 . . . , respectively, and the second gate drivers 421, 422, 423 and 424 may be connected to the odd-numbered gate lines G1, G3 . . . , respectively.

In addition, the first gate drivers 411, 412, 413 and 414 may be connected in the form of a single chip to the entirety of the odd-numbered gate lines G1, G3 . . . , and the second gate drivers 421, 422, 423 and 424 may be connected in the form of a single chip to the entirety of the even-numbered gate lines G2, G4 . . . .

The first gate drivers 411, 412, 413 and 414 may be disposed on one side (e.g., a left side) of the first substrate 110 in the non-display area NDA, and the second gate drivers 421, 422, 423, 424 may be disposed on another side (e.g., a right side) of the first substrate 110 in the non-display area NDA.

As the display device according to an exemplary embodiment includes the first gate drivers 411, 412, 413 and 414 and the second gate drivers 421, 422, 423 and 424 on one side and another side of the first substrate 110, respectively, integration of the gate drivers may be reduced.

Accordingly, a width Wa of the first gate drivers 411, 412, 413 and 414 and the second gate drivers 421, 422, 423 and 424 is reduced, and thus a width Wb of sides of the non-display area NDA of the first substrate 110 may be reduced.

The first gate drivers 411, 412, 413 and 414 and the second gate drivers 421, 422, 423 and 424 alternately apply a gate driving signal composed of a gate on voltage Von and a gate off voltage Voff to the gate lines G1 to Gm.

The data driver 500 applies a data driving signal to the data lines D1 to Dn.

Figure 4:
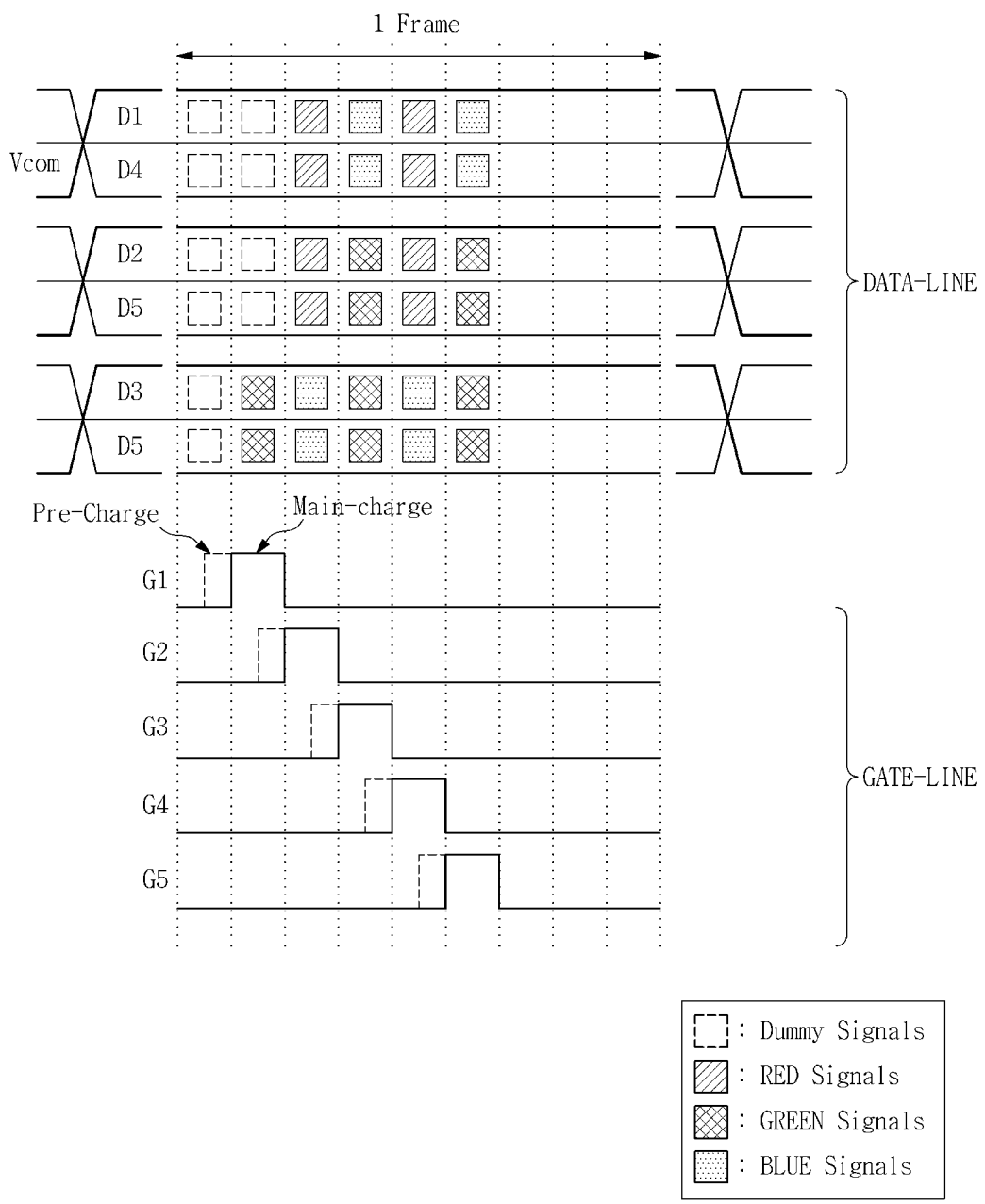
FIG. 4 is a driving timing diagram of a display device according to an exemplary embodiment.

FIG. 4 is a driving timing diagram of a display device according to an exemplary embodiment. Hereinafter, the connection relationship of the gate line, the data line and the pixel according to an exemplary embodiment will be described with reference to FIGS. 2 and 4.

FIGS. 2 and 4 illustrate four gate lines G1, G2, G3 and G4 and seven data lines D1, D2, D3, D4, D5, D6 and D7 for ease of description.

For ease of description, odd-numbered gate lines G1 and G3 are referred to as a first gate line G1 and G3 (even though gate lines G1 and G3 are separate gate lines), and even-numbered gate lines G2 and G4 are referred to as a second gate line G2 and G4 (even though gate lines G2 and G4 are separate gate lines). That is, the first gate line G1 and G3 and the second gate line G2 and G4 may be arranged in an alternating manner along the second direction Y.

The display device according to an exemplary embodiment includes a first pixel group 10 including first, second and third pixels 11, 12 and 13 arranged adjacent to each other and successively along a first direction X, and a second pixel group 20 including fourth, fifth and sixth pixels 21, 22 and 23 arranged adjacent to the first pixel group 10 along the first direction X.

The first pixel group 10 and the second pixel group 20 may be arranged in an alternating manner along both the first direction X and a second direction Y intersecting the first direction X. Accordingly, the first, second, third, fourth, fifth and sixth pixels 11, 12, 13, 21, 22, and 23 may be arranged in an alternating manner along the first direction X, the first pixel 11 and the fourth pixel 21 may be arranged in an alternating manner along the second direction Y, the second pixel 12 and the fifth pixel 22 may be arranged in an alternating manner along the second direction Y, and the third pixel 13 and the sixth pixels 23 may be arranged in an alternating manner along the second direction Y.

The first, second, third, fourth, fifth and sixth pixels 11, 12, 13, 21, 22, and 23 may be connected to corresponding ones of the gate lines G1, G2, G3 and G4 and the data lines D1, D2, D3, D4, D5, D6 and D7 using a switching element such as a TFT.

For example, the second pixel 12, the third pixel 13, the fifth pixel 22 and the sixth pixel 23 may be connected to the first gate line G1 and G3, and the first pixel 11, the third pixel 13, the fourth pixel 21 and the sixth pixel 23 may be connected to the second gate line G2 and G4.

That is, the second pixel 12 and the fifth pixel 22 facing each other with respect to the first gate line G1 and G3 may be connected to the first gate line G1 and G3, and the first pixel 11 and the fourth pixel 21 facing each other with respect to the second gate line G2 and G4 may be connected to the second gate line G2 and G4.

In addition, the third pixel 13 and the sixth pixel 23 may face each other with respect to the first gate line G1 and G3 and be connected to different gate lines, respectively.

The first pixel 11, the second pixel 12 and the third pixel 13 may be connected to the odd-numbered data lines D1, D3, D5 and D7, and the fourth pixel 21, the fifth pixel 22 and the sixth pixel 23 may be connected to the even-numbered data lines D2, D4 and D6.

However, exemplary embodiments are not limited thereto, and the first pixel 11, the second pixel 12 and the third pixel 13 may be connected to the even-numbered data lines D2, D4 and D6, and the fourth pixel 21, the fifth pixel 22 and the sixth pixel 23 may be connected to the odd-numbered data lines D1, D3, D5 and D7.

In an exemplary embodiment, the odd-numbered data lines D1, D3, D5 and D7 may receive voltages having a different polarity from a polarity of voltages applied to the even-numbered data lines D2, D4 and D6. For example, the odd-numbered data lines D1, D3, D5 and D7 may receive a positive voltage and the even-numbered data lines D2, D4 and D6 may receive a negative voltage. On the contrary, the odd-numbered data lines D1, D3, D5 and D7 may receive a negative voltage and the even-numbered data lines D2, D4 and D6 may receive a positive voltage.

With the above-described structure, the first, second and third pixels 11, 12 and 13 included in the first pixel group 10 may receive voltages of a same polarity and the fourth, fifth and sixth pixels 21, 22 and 23 included in the second pixel group 20 may receive voltages of a same polarity. In addition, the first, second and third pixels 11, 12 and 13 may receive voltages having a different polarity from the polarity of voltages applied to the fourth, fifth and sixth pixels 21, 22 and 23.

The first pixel 11 and the fourth pixel 21 may, in one embodiment, be any one selected from a red pixel and a green pixel. The first pixel 11 and the fourth pixel 21 according to an exemplary embodiment will be described on the premise that they are red pixels.

The second pixel 12 and the fifth pixel 22 may, in one embodiment, be any one selected from a red pixel and a green pixel. The second pixel 12 and the fifth pixel 22 according to an exemplary embodiment will be described on the premise that they are green pixels.

The third pixel 13 and the sixth pixel 23 may be blue pixels.

As such, by connecting the first, second, third, fourth, fifth and sixth pixels 11, 12, 13, 21, 22, and 23, the gate lines G1, G2, G3 and G4, and the data lines D1, D2, D3, D4, D5, D6 and D7 to one another in the manner shown, horizontal line defects may be substantially prevented and display quality may be improved.

For example, since the first pixel 11 and the fourth pixel 21, which are arranged in an alternating manner along the second direction Y, are connected to a same gate line G2, marks that may appear due to gate line delays may not be recognized. Further, since data voltages of different polarities are applied to respective ones of the first pixel 11 and the fourth pixel 21 that are arranged in an alternating manner along the second direction Y, a line flickering phenomenon may not be recognized.

Similarly, since the second pixel 12 and the fifth pixel 22, which are arranged in an alternating manner along the second direction Y, are connected to a same gate line G3, marks that may appear due to gate line delays may not be recognized. Further, since data voltages of different polarities are applied to respective ones of the second pixel 12 and the fifth pixel 22 that are arranged in an alternating manner along the second direction Y, a line flickering phenomenon may not be recognized.

Since the third pixel 13 and the sixth pixel 23 receive gate driving signals from different gate lines, marks may appear due to gate line delays. However, since the third pixel 13 and the sixth pixel 23 are blue pixels having low visibility, the marks may not be recognized as defects.

In an exemplary embodiment, referring to FIG. 4, a pre-charge time may be further added in driving in addition to a main charge time. That is, since the gate lines G1, G2, G3, G4 and G5 are provided in each row, there is a possibility that a charging rate may be reduced. In order to increase the charging rate, the pre-charge time may be further added. The pre-charge time may be applied up to ½ of a maximum main charge time.

Figure 5:
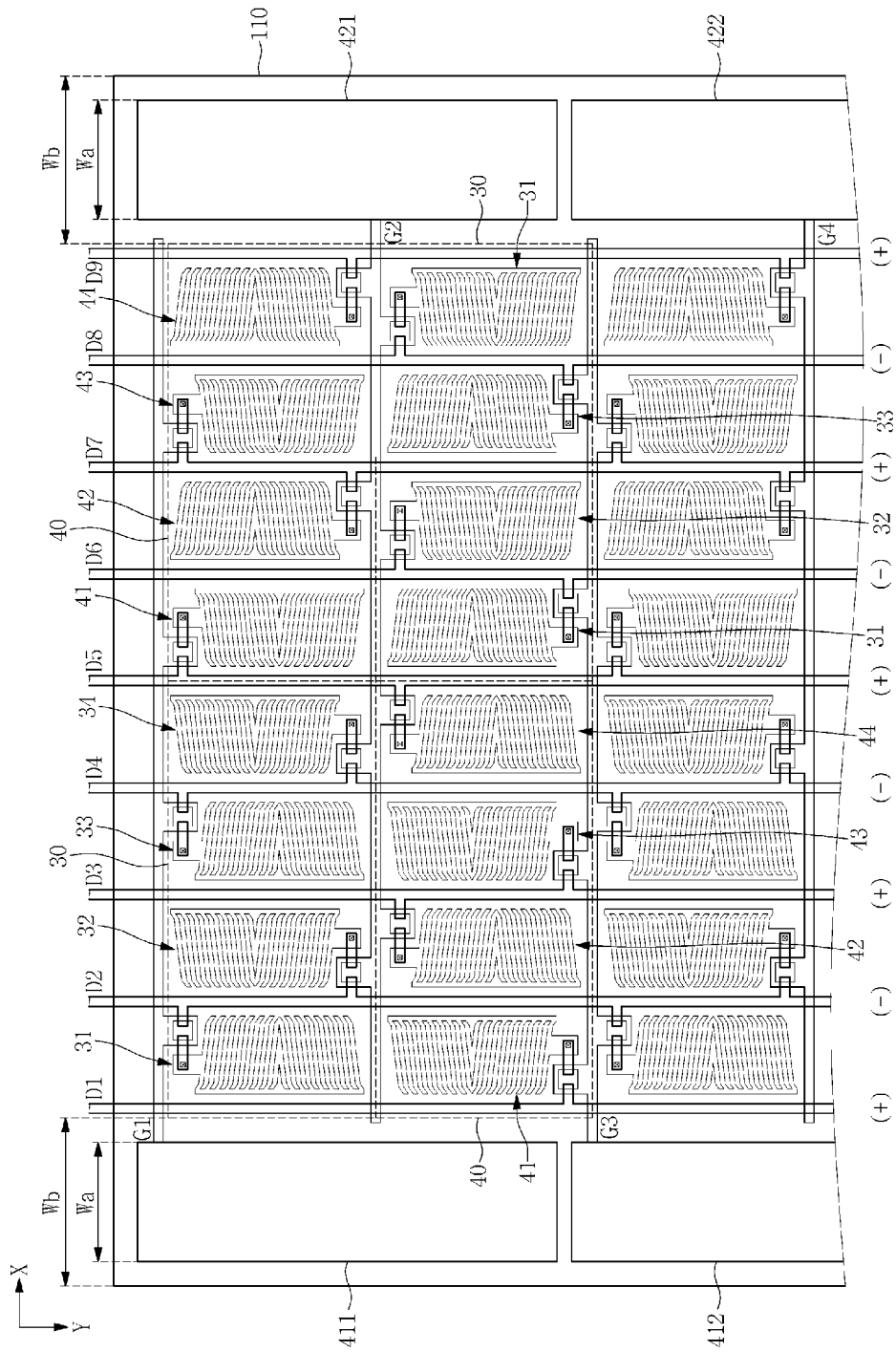
FIG. 5 is a schematic plan view illustrating a display device according to an alternative exemplary embodiment.
Figure 6:
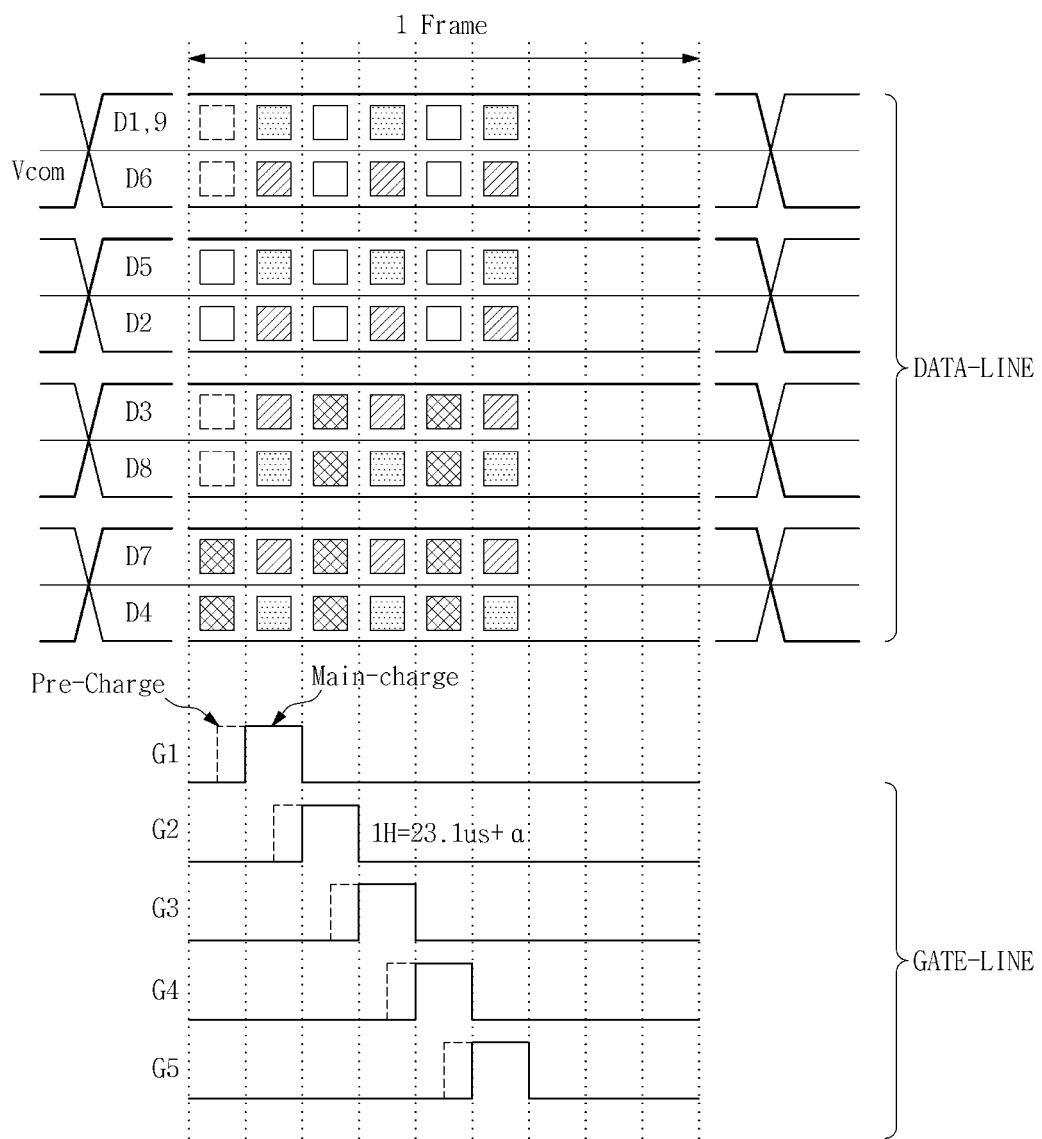
FIG. 6 is a driving timing diagram of a display device according to an alternative exemplary embodiment.

FIG. 5 is a schematic plan view illustrating a display device according to an alternative exemplary embodiment, and FIG. 6 is a driving timing diagram of a display device according to an alternative exemplary embodiment. Elements that have already been described in previous embodiments are not repeated below.

FIGS. 5 and 6 illustrate four gate lines G1, G2, G3 and G4 and nine data lines D1, D2, D3, D4, D5, D6, D7, D8 and D9 for ease of description.

For ease of description, odd-numbered gate lines G1 and G3 are referred to as a first gate line G1 and G3 (even though gate lines G1 and G3 are separate gate lines), and even-numbered gate lines G2 and G4 are referred to as a second gate line G2 and G4 (even though gate lines G2 and G4 are separate gate lines). That is, the first gate line G1 and G3 and the second gate line G2 and G4 may be arranged in an alternating manner along a second direction Y.

The display device according to an alternative exemplary embodiment may include a first pixel group 30 including first, second, third and fourth pixels 31, 32, 33 and 34 arranged along a first direction X, and a second pixel group 40 including fifth, sixth, seventh and eighth pixels 41, 42, 43 and 44 arranged along the first direction X.

The first pixel group 30 and the second pixel group 40 may be arranged in a matrix form. Accordingly, the first, second, third, fourth, fifth, sixth, seventh and eighth pixels 31, 32, 33, 34, 41, 42, 43 and 44 may be arranged in an alternating manner along the first direction X, the first pixel 31 and the fifth pixel 41 may be arranged in an alternating manner along the second direction Y, the second pixel 32 and the sixth pixel 42 may be arranged in an alternating manner along the second direction Y, the third pixel 33 and the seventh pixel 43 may be arranged in an alternating manner along the second direction Y, and the fourth pixel 34 and the eighth pixel 44 may be arranged in an alternating manner along the second direction Y.

The first, second, third, fourth, fifth, sixth, seventh and eighth pixels 31, 32, 33, 34, 41, 42, 43 and 44 may be connected to corresponding ones of the gate lines G1, G2, G3 and G4 and the data lines D1, D2, D3, D4, D5, D6, D7, D8 and D9 using a switching element such as a TFT.

For example, the first pixel 31, the third pixel 33, the fifth pixel 41 and the seventh pixel 43 may be connected to the first gate line G1 and G3 and the second pixel 32, the fourth pixel 34, the sixth pixel 42 and the eighth pixel 44 may be connected to the second gate line G2 and G4.

That is, the first pixel 31 and the fifth pixel 41 facing each other with respect to the first gate line G1 and G3 are connected to the first gate line G1 and G3, and the third pixel 33 and the seventh pixel 43 facing each other with respect to the first gate line G1 and G3 may be connected to the first gate line G1 and G3.

Similarly, the second pixel 32 and the sixth pixel 42 facing each other with respect to the second gate line G2 and G4 may be connected to the second gate line G2 and G4, and the fourth pixel 34 and the eighth pixel 44 facing each other with respect to the second gate line G2 and G4 may be connected to the second gate line G2 and G4.

The first pixel 31, the second pixel 32, the third pixel 33 and the fourth pixel 34 may be connected to the even-numbered data lines D2, D4, D6 and D8, and the fifth pixel 41, the sixth pixel 42, the seventh pixel 43 and the eighth pixel 44 may be connected to the odd-numbered data lines D1, D3, D5, D7 and D9.

However, exemplary embodiments are not limited thereto. In an exemplary embodiment, the first pixel 31, the second pixel 32, the third pixel 33 and the fourth pixel 34 may be connected to the odd-numbered data lines D1, D3, D5, D7 and D9, and the fifth pixel 41, the sixth pixel 42, the seventh pixel 43 and the eighth pixel 44 may be connected to the even-numbered data lines D2, D4, D6 and D8.

In an exemplary embodiment, the odd-numbered data lines D1, D3, D5, D7 and D9 may receive voltages having a different polarity from a polarity of voltages applied to the even-numbered data lines D2, D4, D6 and D8. For example, the odd-numbered data lines D1, D3, D5, D7 and D9 may receive a positive voltage and the even-numbered data lines D2, D4, D6 and D8 may receive a negative voltage. On the contrary, the odd-numbered data lines D1, D3, D5, D7 and D9 may receive a negative voltage and the even-numbered data lines D2, D4, D6 and D8 may receive a positive voltage.

With the above-described structure, the first, second, third and fourth pixels 31, 32, 33 and 34 included in the first pixel group 30 may receive voltages of a same polarity and the fifth, sixth, seventh and eighth pixels 41, 42, 43 and 44 included in the second pixel group 40 may receive voltages of a same polarity. In addition, the first, second, third and fourth pixels 31, 32, 33 and 34 may receive voltages of a different polarity from a polarity of voltages applied to the fifth, sixth, seventh and eighth pixels 41, 42, 43 and 44.

The first, second, third and fourth pixels 31, 32, 33 and 34 may be any one selected from a red pixel, a green pixel, a blue pixel and a white pixel, and the fifth, sixth, seventh and eighth pixels 41, 42, 43 and 44 may be any one selected from a red pixel, a green pixel, a blue pixel and a white pixel.

As such, by connecting the first, second, third, fourth, fifth, sixth, seventh and eighth pixels 31, 32, 33, 34, 41, 42, 43 and 44, the gate lines G1, G2, G3 and G4, and the data lines D1, D2, D3, D4, D5, D6, D7, D8 and D9 to one another in the manner shown, horizontal line defects may be substantially prevented and the display quality may be improved.

For example, since the first pixel 31 and the fifth pixel 41, which are arranged in an alternating manner along the second direction Y, are connected to a same gate line G2, marks that may appear due to gate line delays may not be recognized. Further, since data voltages of different polarities are applied to respective ones of the first pixel 31 and the fifth pixel 41 that are arranged in an alternating manner along the second direction Y, a line flickering phenomenon may not be recognized.

In an exemplary embodiment, referring to FIG. 6, a pre-charge time may be further added in driving in addition to a main charge time. That is, since the gate lines G1, G2, G3, G4 and G5 are provided in each row, there is a possibility that a charging rate may be reduced. In order to increase the charging rate, the pre-charge time may be further added. The pre-charge time may be applied up to ½ of a maximum main charge time.

As set forth hereinabove, in one or more exemplary embodiments, the display device may realize a narrow bezel by significantly reducing an area occupied by the gate driver.

Further, in one or more exemplary embodiments, the display device may improve display quality by substantially preventing horizontal line defects.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings. Various features of the above described and other embodiments may be mixed and matched in any manner, to produce further embodiments consistent with the invention.

What is claimed is:

1. A display device comprising:
   a first pixel group comprising first, second and third pixels, the first, second and third pixels being arranged adjacent to each other and positioned successively along a first direction; and
   a second pixel group comprising fourth, fifth and sixth pixels, the fourth, fifth and sixth pixels being arranged adjacent to the first, second and third pixels, respectively, and positioned successively along the first direction,
   wherein multiple ones of each of the first pixel group and the second pixel group are arranged in an alternating manner along both the first direction and a second direction intersecting the first direction, and
   wherein the second pixel and the fifth pixel face each other on opposite sides of a first gate line in the second direction while the second pixel and the fifth pixel are connected to the first gate line and receive a same first gate signal, and the first pixel and the fourth pixel face each other on opposite sides of a second gate line in the second direction while the first pixel and the fourth pixel are connected to the second gate line and receive a same second gate signal, and
   wherein one of the third pixel and the sixth pixel is connected to the first gate line that is connected to the second pixel and the fifth pixel and provides the same first gate signal, and the other of the third pixel and the sixth pixel is connected to the second gate line that is connected to the first pixel and the fourth pixel and provides the same second gate signal.

2. The display device as claimed in claim 1, wherein the third pixel and the sixth pixel face each other with respect to the first gate line and are connected to different gate lines, respectively.

3. The display device as claimed in claim 1, wherein the first, second and third pixels are connected to an odd-numbered data line, and the fourth, fifth and sixth pixels are connected to an even-numbered data line.

4. The display device as claimed in claim 1, further comprising:
   a first gate driver disposed proximate to one side of a substrate and connected to the first gate line; and
   a second gate driver disposed proximate to another side of the substrate and connected to the second gate line.

5. The display device as claimed in claim 1, wherein the first gate line and the second gate line extend in the first direction and are arranged in an alternating manner along the second direction.

6. The display device as claimed in claim 3, wherein the odd-numbered data line and the even-numbered data line extend in the second direction and are arranged in an alternating manner along the first direction.

7. The display device as claimed in claim 1, wherein the first pixel and the fourth pixel are arranged in an alternating manner along the second direction.

8. The display device as claimed in claim 1, wherein the second pixel and the fifth pixel are arranged in an alternating manner along the second direction.

9. The display device as claimed in claim 1, wherein the third pixel and the sixth pixel are arranged in an alternating manner along the second direction.

10. The display device as claimed in claim 3, wherein the odd-numbered data line is configured so as to receive a voltage having a different polarity from a polarity of a voltage configured to be applied to the even-numbered data line.

11. The display device as claimed in claim 1, wherein the first, second and third pixels are configured to receive voltages having a different polarity from a polarity of voltages configured to be applied to the fourth, fifth and sixth pixels.

12. The display device as claimed in claim 1, wherein the first pixel and the fourth pixel are each pixels selected from a red pixel and a green pixel.

13. The display device as claimed in claim 1, wherein the second pixel and the fifth pixel are each pixels selected from a red pixel and a green pixel.

14. The display device as claimed in claim 1, wherein the third pixel and the sixth pixel are blue pixels.

15. A display device comprising:
- a first pixel group comprising first, second, third and fourth pixels, the first, second, third and fourth pixels being arranged adjacent to each other and positioned successively along a first direction; and
- a second pixel group comprising fifth, sixth, seventh and eighth pixels, the fifth, sixth, seventh and eighth pixels being arranged adjacent to the first, second, third and fourth pixels, respectively, and positioned successively along the first direction,
- wherein multiple ones of each of the first pixel group and the second pixel group are arranged in an alternating manner along both the first direction and a second direction intersecting the first direction,
- wherein the first pixel and the fifth pixel face each other with respect to a first gate line that extends in the first direction while the first pixel and the fifth pixel are connected to the first gate line and receives a same first gate signal, and the third pixel and the seventh pixel face each other with respect to the first gate line while the third pixel and the seventh pixel are connected to the first gate line and receives the same first gate signal,
- wherein the second pixel and the sixth pixel face each other with respect to a second gate line that extends in the first direction while the second pixel and the sixth pixel are connected to the second gate line and receives a same second gate signal, and the fourth pixel and the eighth pixel face each other with respect to the second gate line while the fourth pixel and the eighth pixel are connected to the second gate line and receives the same second gate signal,
- wherein the first pixel and the second pixel face each other on opposite sides of a first data line that extends in the second direction while the first pixel and the second pixel are connected to the first data line, and the third pixel and the fourth pixel face each other on opposite sides of a second data line that extends in the second direction while the third pixel and the fourth pixel face are connected to the second data line, and
- wherein the sixth pixel and the seventh pixel face each other on opposite sides of a third data line that extends in the second direction while the sixth pixel and the seventh pixel are connected to the third data line, and the fifth pixel of a first pixel row and the eighth pixel of a second pixel row adjacent to the first pixel row face each other on opposite sides of a fourth data line that extends in the second direction while the fifth pixel of the first pixel row and the eighth pixel of the second pixel row adjacent to the first pixel row are connected to the fourth data line.

16. The display device as claimed in claim 15, wherein the first, second, third and fourth pixels are connected to an even-numbered data line, and the fifth, sixth, seventh and eighth pixels are connected to an odd-numbered data line.

17. The display device as claimed in claim 16, wherein the odd-numbered data line is configured to receive a voltage having a different polarity from a polarity of a voltage configured to be applied to the even-numbered data line.

18. The display device as claimed in claim 15, wherein the first, second, third and fourth pixels are configured to receive voltages having a different polarity from a polarity of voltages configured to be applied to the fifth, sixth, seventh and eighth pixels.

19. The display device as claimed in claim 3, wherein the first and third pixels are connected to different data lines, respectively and, the fourth and sixth pixels are connected to different data lines, respectively.

\* \* \* \* \*